(12) United States Patent
Kimura et al.

(10) Patent No.: US 7,704,797 B2
(45) Date of Patent: Apr. 27, 2010

(54) MODULE AND METHOD OF MANUFACTURING THE SAME

(75) Inventors: Junichi Kimura, Aichi (JP); Yoshitsugu Uenishi, Nara (JP); Masanori Sadano, Aichi (JP); Yoshihisa Maehata, Gifu (JP); Nobuhiro Tada, Osaka (JP)

(73) Assignee: Panasonic Corporation, Osaka (JP)

( * ) Notice: Subject to any disclaimer, the term of this patent is extended or adjusted under 35 U.S.C. 154(b) by 476 days.

(21) Appl. No.: 11/826,492

(22) Filed: Jul. 16, 2007

(65) Prior Publication Data

US 2008/0017969 A1  Jan. 24, 2008

(30) Foreign Application Priority Data

Jul. 20, 2006  (JP)  ............................. 2006-197907

(51) Int. Cl.
  *H01L 21/48*  (2006.01)
  *H01L 29/40*  (2006.01)
(52) U.S. Cl. ...................... 438/118; 257/783
(58) Field of Classification Search .................. 257/753, 257/772, 779–783, E23.015, E23.02, E23.023–E23.079; 438/118, 125
See application file for complete search history.

(56) References Cited

U.S. PATENT DOCUMENTS

| 6,153,930 A | 11/2000 | Hori |
| 2007/0221711 A1* | 9/2007 | Wada et al. ............... 228/248.1 |
| 2008/0093739 A1* | 4/2008 | Kimura et al. ............... 257/737 |

FOREIGN PATENT DOCUMENTS

JP  11-214586  8/1999

* cited by examiner

*Primary Examiner*—Calvin Lee
(74) *Attorney, Agent, or Firm*—McDermott Will & Emery LLP

(57) ABSTRACT

A method of manufacturing a module, formed of a semiconductor element flip-chip bonded to a substrate and chip component soldered to the substrate, is disclosed. The method includes a step of mounting the chip component and the semiconductor element to the substrate, a first injection step for injecting first resin from a center of a lateral face of the semiconductor element into a gap between the semiconductor element and the substrate, a second injection step for applying second resin having a greater viscosity than the first resin to corners of the semiconductor element before the first resin reaches the corners, and a curing step for heating the module. This method allows mounting the chip component closer to the semiconductor element, so that the component can be mounted at a higher density on the module.

9 Claims, 15 Drawing Sheets

MODULE AND METHOD OF MANUFACTURING THE SAME

FIELD OF THE INVENTION

The present invention relates to a module to which a semiconductor element is mounted in a flip-chip bonding manner with solder-bumps, and it also relates to a method of manufacturing the same module.

BACKGROUND OF THE INVENTION

A method of manufacturing a conventional module is described hereinafter with reference to FIGS. 12-14. FIG. 12 shows a flowchart illustrating a method of manufacturing the conventional module. FIG. 13A shows a top view of the conventional module at an injection step shown in FIG. 12. FIG. 13B shows a lateral view of the conventional module at the injection step shown in FIG. 12. The method of manufacturing conventional module 100, namely, a semiconductor mounted substrate, is described following the order of the steps shown in FIG. 12.

Application step S121 supplies solder 103 and flux 104 to substrate 102. Solder 103 is formed of cream solder. Mounting step S122 takes place after application step S121, and mounts chip component 105 as well as semiconductor element 106 to substrate 102. A clearance of approx. 0.5 mm is provided between chip component 105 and semiconductor element 106. Solder bumps (not shown) are provided to semiconductor element 106. Reflow step S123 takes place after mounting step S122, and melts solder 103 as well as the solder bumps for connecting chip component 105 and semiconductor element 106 to substrate 102.

Injection step S124 takes place after reflow step S123, and injects resin 110 into a gap between semiconductor element 106 and substrate 102, and then curing step S125 cures resin 110, thereby completing module 100. Conventional module 100 and the manufacturing method of module 100 discussed above are disclosed in, e.g. Japanese Unexamined Patent Publication No. H11-214586.

FIG. 14A shows a sectional view of chip component 105 of conventional module 100, and FIG. 14B shows a sectional view illustrating an essential part of a soldered section of chip component 105 of conventional module 100.

When the foregoing manufacturing method mounts chip component 105 closely to semiconductor element 106 with a clearance in between as close as 0.3 mm, resin 110 injected sometimes cover both of chip component 105 and solder 103. Since the gap between chip component 105 and substrate 102 is smaller than that between semiconductor element 106 and substrate 102, resin 110 is hard to enter into the gap between chip component 105 and substrate 102. Therefore, as shown in FIGS. 14A and 14B, void 115 where resin 110 is not filled is formed between chip component 105 and substrate 102. Then resin 110 sometimes covers both of chip component 105 and solder 103 although void 115 still exists.

SUMMARY OF THE INVENTION

The present invention provides a module in which resin is prevented from covering chip component, and on which chip component and semiconductor element are mounted at a higher density. The present invention also provides a method of manufacturing the same module.

The method of manufacturing the module is used for manufacturing a module having a semiconductor element flip-chip bonded on a substrate and chip component soldered to the substrate. The method comprises the steps of: mounting a chip component and a semiconductor element onto the substrate; first injection of injecting a first resin into a gap between the semiconductor element and the substrate from a center of a lateral face of the semiconductor element; second injection of applying a second resin having a greater viscosity than the first resin to corners of the semiconductor element before the first resin arrives at the corners of the semiconductor element; and curing the module by heating. The foregoing method allows mounting the semiconductor element and the chip component close to each other, so that the module on which component can be mounted at a higher density is obtainable.

The module of the present invention comprising: a substrate; a semiconductor element; chip component; a first thermosetting resin; and a second thermosetting resin. The semiconductor is flip-chip bonded to the substrate with solder bumps, and the chip component is soldered to the substrate closely to the semiconductor element. The first thermosetting resin is formed in a gap between the semiconductor element and the substrate, and the second thermosetting resin couples corners of the semiconductor element to the substrate. The second resin has a greater viscosity than the first resin. The foregoing structure allows mounting the semiconductor element and the chip component closely to each other on the substrate, so that the module with the components mounted at a higher density is obtainable.

DETAILED DESCRIPTION OF EMBODIMENT

Figure 1A:
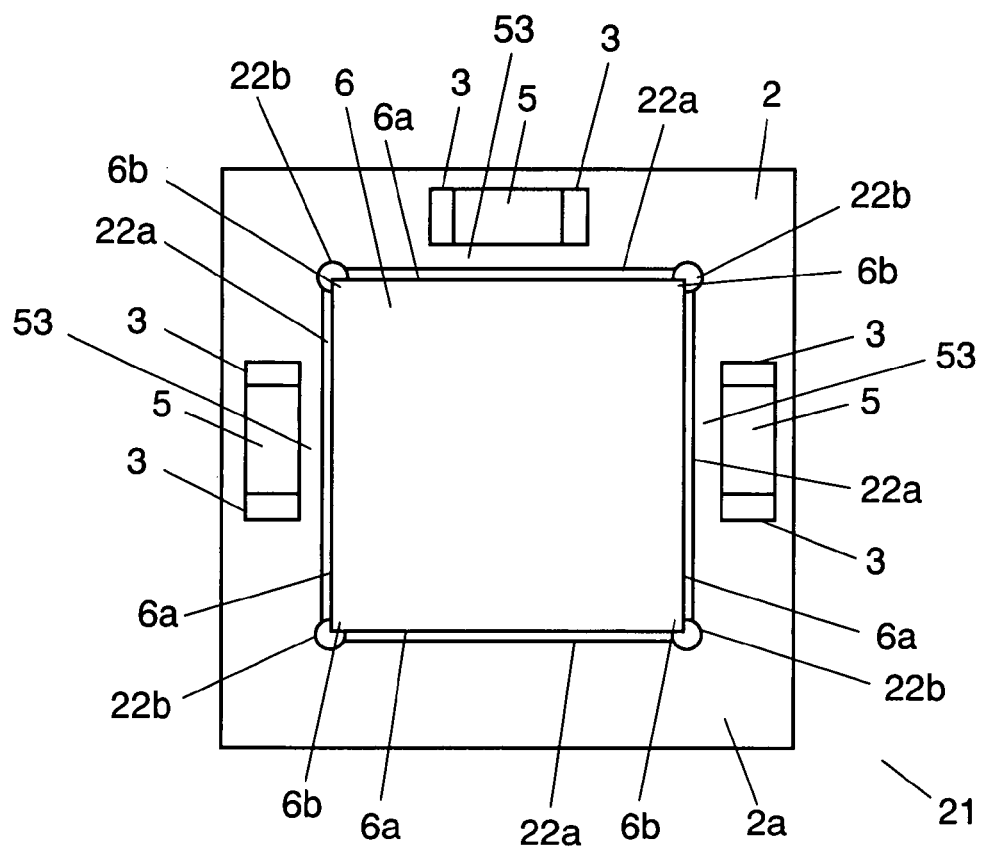
FIG. 1A shows a top view of a module in accordance with an embodiment of the present invention.
Figure 1B:
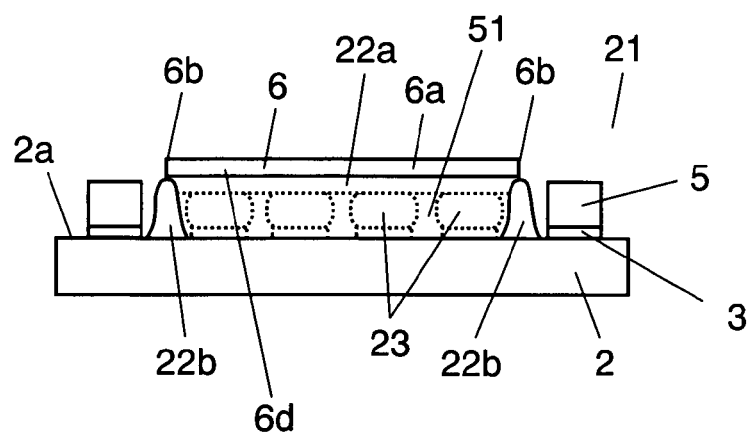
FIG. 1B shows a lateral view of the module shown in FIG. 1A.
Figure 2:
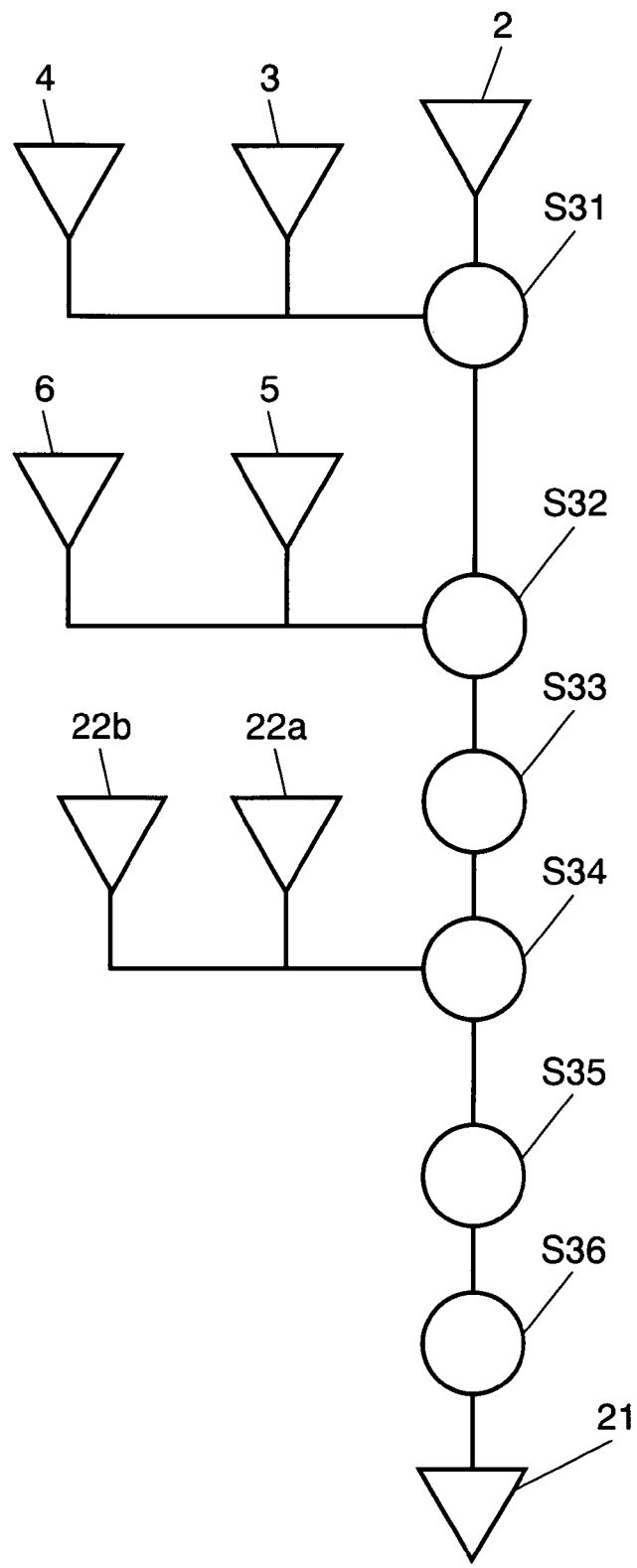
FIG. 2 shows a flowchart illustrating a method of manufacturing a module in accordance with the embodiment of the present invention.
Figure 3A:
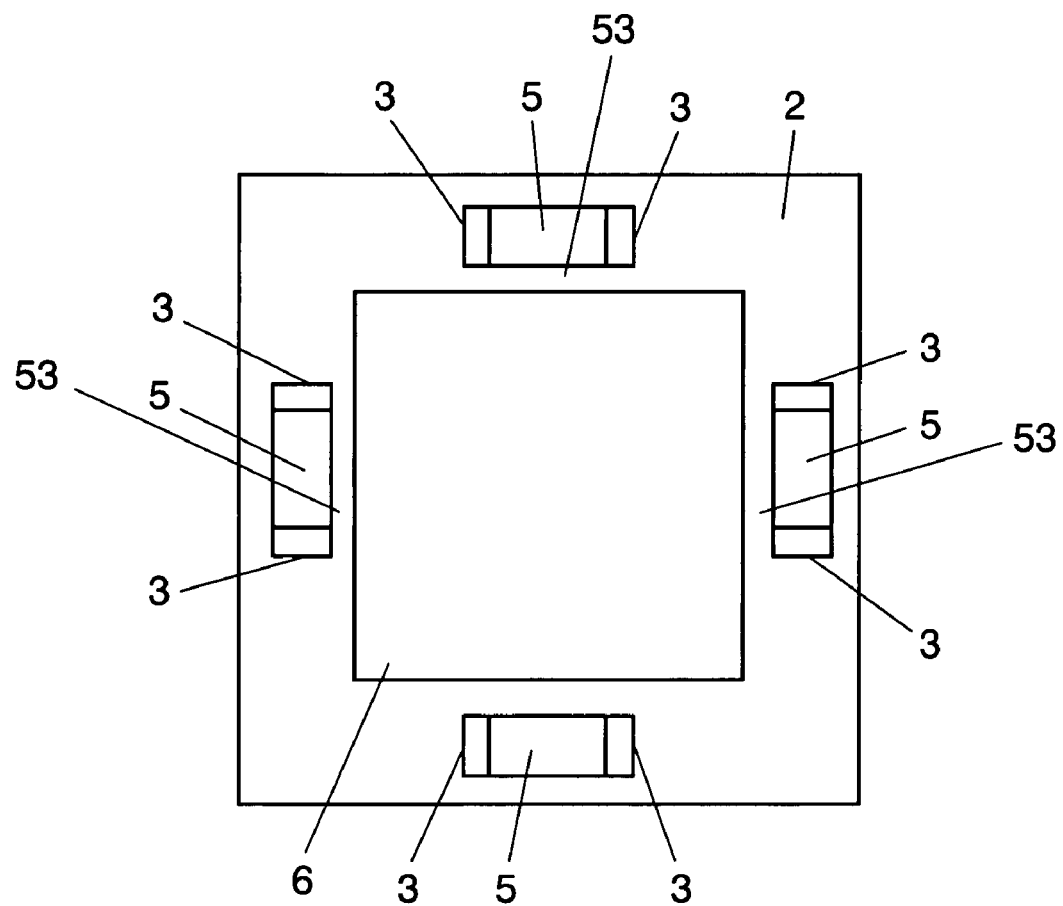
FIG. 3A shows a top view of a module at a mounting step shown in FIG. 2.
Figure 3B:
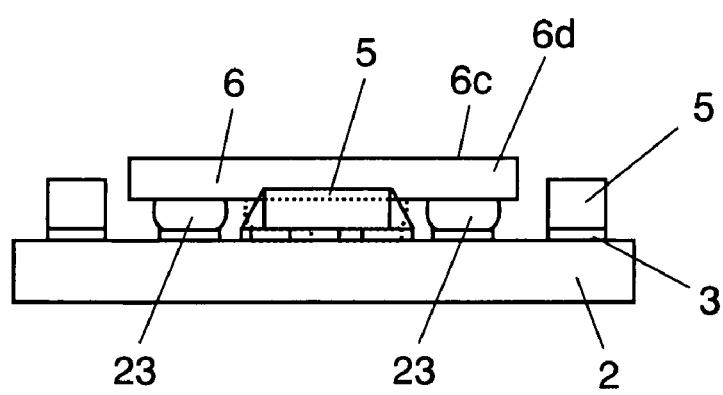
FIG. 3B shows a lateral view of the module shown in FIG. 3A.
Figure 4A:
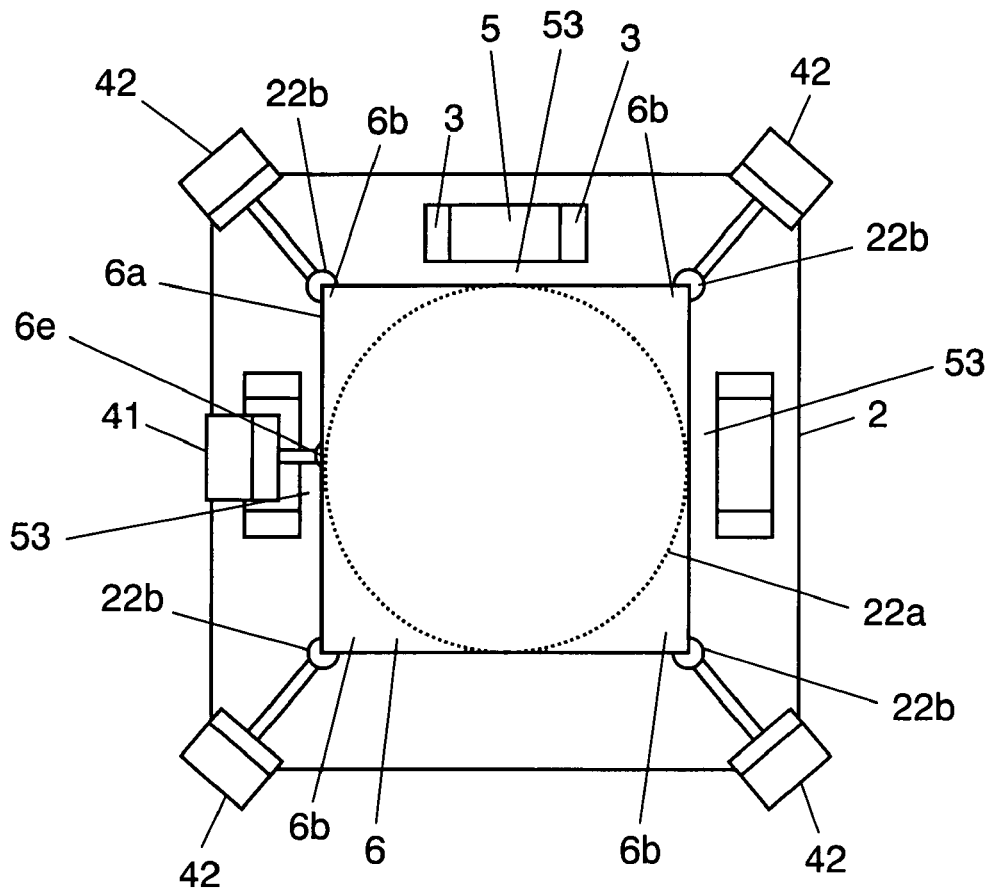
FIG. 4A shows a top view of a module at an injection step shown in FIG. 2.
Figure 4B:
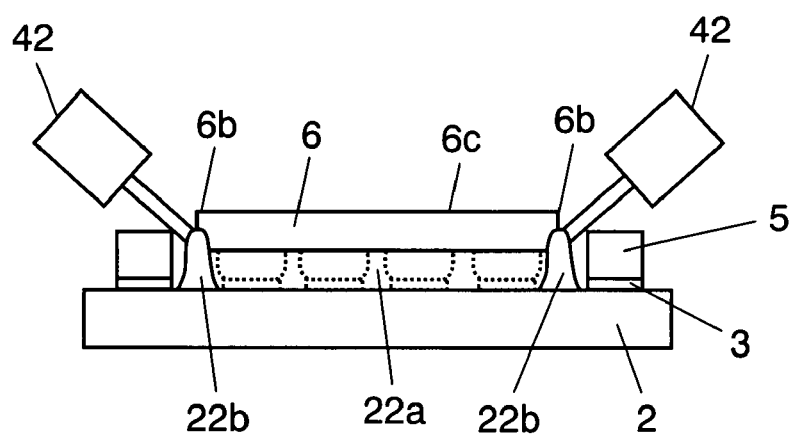
FIG. 4B shows a lateral view of the module shown in FIG. 4A.
Figure 5A:
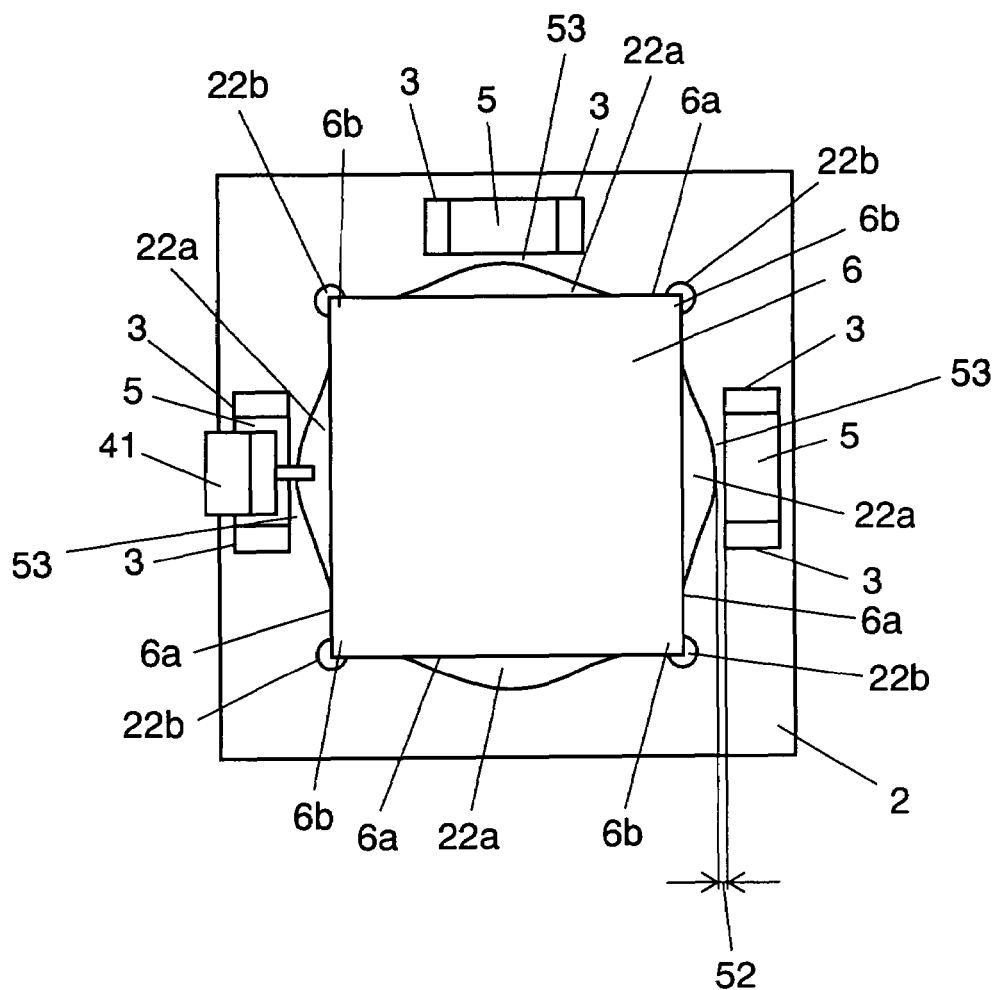
FIG. 5A shows a top view of a module at the injection step shown in FIG. 2.
Figure 5B:
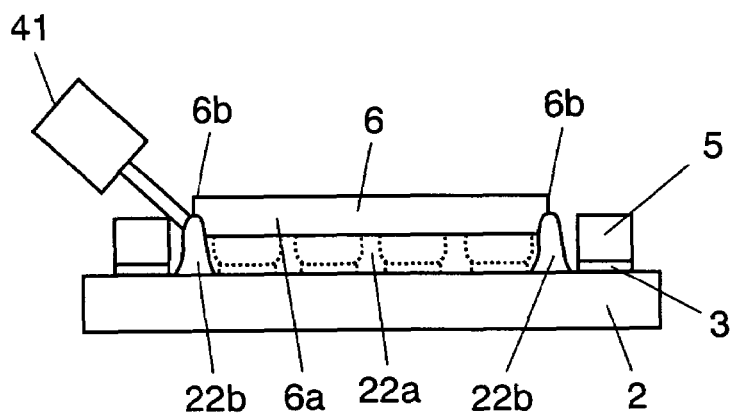
FIG. 5B shows a lateral view of the module shown in FIG. 5A.

An embodiment of the present invention is demonstrated hereinafter with reference to accompanying drawings. FIG. 1A shows a top view of module 21 in accordance with the embodiment of the present invention. FIG. 1B shows a lateral view of module 21 shown in FIG. 1A. FIG. 2 is a flowchart illustrating a method of manufacturing module 21 shown in FIG. 1. FIG. 3A shows a top view of a module at mounting step S32 shown in FIG. 2. FIG. 3B shows a lateral view of the module shown in FIG. 3A. FIGS. 4A and 5A show top views of the module at injection step S34 shown in FIG. 2. FIG. 4B shows a lateral view of the module shown in FIG. 4A. FIG. 5B shows a lateral view of the module shown in FIG. 5A.

In FIGS. 1A and 1B, module 21, i.e. a substrate with a semiconductor element mounted, includes chip components 5 and semiconductor element 6 both mounted on active surface 2a of substrate 2. Chip components 5 are coupled to substrate 2 via solder 3. Semiconductor element 6 is flip-chip bonded to substrate 2 via solder bumps 23. First thermosetting resin 22a (hereinafter referred to simply as resin 22a) is put in gap 51 between semiconductor element 6 and substrate 2, so that the connection between semiconductor element 6 and substrate 2 can be tightly maintained. Second thermosetting resin 22b (hereinafter referred simply to as resin 22b) is bonded to corners 6b of semiconductor element 6.

Semiconductor element 6 is formed of silicon substrate 6d and a redistribution layer (not shown) provided on silicon substrate 6d. Pad terminals are formed on the redistribution layer, and are connected to solder bumps 23. The redistribution layer is formed of polyimide resin or the like.

Steps of manufacturing module 21 in accordance with the embodiment of the present invention are described hereinafter following the order of the steps shown in FIG. 2. Application step S31 supplies solder 3 and flux 4 to substrate 2. Solder 3 is formed of cream solder, and is screen-printed at the place where semiconductor element 6 is to be mounted. Flux 4 is applied by a transfer printing method to the place where semiconductor element 6 is to be mounted.

Next, mounting step S32 takes place after application step S31, and mounts chip components 5 and semiconductor element 6 to substrate 2 with a clearance of approx. 0.5 mm between chip components 5 and semiconductor element 6. Solder bumps 23 are provided at an underside of semiconductor element 6.

Then reflow step S33 takes place after mounting step S32, and melts both of solder 3 and solder bumps 23 for coupling chip components 5 and semiconductor element 6 to substrate 2.

Then injection step S34 takes place after reflow step S33, and injects as well as applies resin 22a and resin 22b. Injection step S34 includes a second injection step, which applies resin 22b to four corners 6b of semiconductor element 6 simultaneously. Injection step S34 further includes a first injection step, which injects resin 22a to gap 51 between semiconductor element 6 and substrate 2. Resin 22a and resin 22b thus can be applied simultaneously, so that the productivity of module 21 can be improved.

In injection step S34, resin 22b is applied to corners 6b before resin 22a arrives at corners 6b. To be more specific, resin 22a is injected through first dispenser 41 at the vicinity of center section 6e of lateral face 6a of semiconductor element 6. At approx. the same time as the start of injecting resin 22a, resin 22b is injected through second dispenser 42. It takes some time for resin 22a to fill gap 51 between semiconductor element 6 and substrate 2 and arrive at gaps between corners 6b and substrate 2. On the other hand, resin 22b is applied directly to each one of four corners 6b through four dispensers 42, so that time "t2" needed for completing the application of resin 22b is substantially shorter than time "t1" needed for completing the filling of gap 51 with resin 22a. Use of this time lag, $\Delta t = t1 - t2$, allows the injection of resin 22a and the application of resin 22b to be carried out in parallel. As a result, the time needed for injection step S34 can be shortened, and the productivity of module 21 can be improved.

Through the steps discussed above, resin 22b is applied to corners 6b, and resin 22a is applied to the underside of semiconductor element 6 except corners 6b. The applied amount of resin 22a thus becomes less by the amount of resin 22b applied to corners 6b. Since the applied amount of resin 22a is small, an overflow of resin 22a from the underside of semiconductor element 6, i.e. overflow to an outside of gap 51, is suppressed in injection step S34. This suppression of overflow allows curbing resin 22a to cover chip component 5 even if clearances 53 between semiconductor element 6 and chip components 5 are small.

Chip components 5 can be densely mounted on substrate 2, so that module 21 with the components mounted at a higher density is obtainable with ease.

On top of that, through the steps discussed above, clearances 52 are formed between resin 22a and chip components 5 or solder 3. In other words, when resin 22a is injected in the first injection step, the overflow of resin 22a from gap 51 to the outside of gap 51 is suppressed, so that even if resin 22a flows out from gap 51, clearances 52 are provided between resin 22a and solder 3 that fixes chip components 5. Clearances 52 thus suppress the contact between resin 22a and chip components 5 or solder 3. In other words, the module produced through a conventional manufacturing method sometimes has the resin cover the solder and the chip components adjacent to the semiconductor element when the chip components are mounted close to the semiconductor element with a clearance of, e.g. as close as 0.3 mm. The gaps between the chip components and the substrate are smaller than those between the semiconductor element and the substrate. This structure allows the resin to resist entering into the gaps between the chip components and the substrate. Thus the resin sometimes covers both of the chip components and the solder although voids still remain not filled with the resin. In the case of reflow-soldering the conventional module onto a mother board, the solder is melt by heating, and at this time, the solder except the voids is covered with resin. Cubical expansion of the solder being melt allows the solder to flow into the voids, so that the solder is shorted to each other beneath the chip components sometimes. Considering the phenomena discussed above, it is not recommended that the clearance between the chip components and the semiconductor element be reduced in the conventional module. However, module 21 of the present invention curbs the contact between resin 22a and solder 3 or chip components 5 adjacent to semiconductor element 6. When module 21 is soldered to a mother board (not shown), solder 3 thus resists flowing into the gaps between chip components 5 and substrate 2. As a result, a short of solder 3 to each other beneath each one of chip components 5 can be suppressed.

Figure 6A:
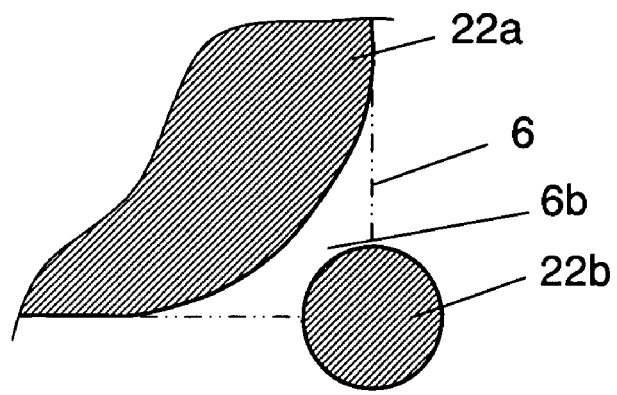
FIG. 6A shows an essential part of a sectional view of a module at the injection step shown in FIG. 2.
Figure 6B:
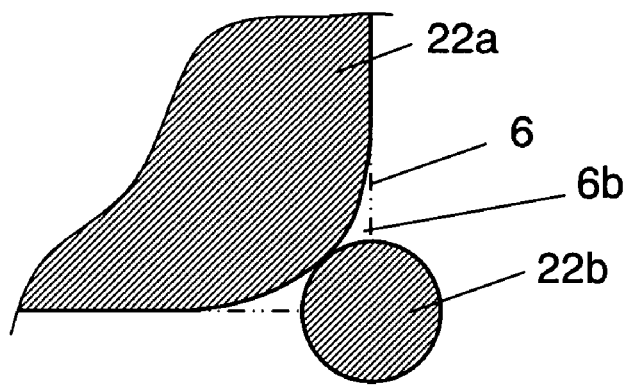
FIG. 6B shows an essential part of a sectional view of a module at the injection step shown in FIG. 2.
Figure 6C:
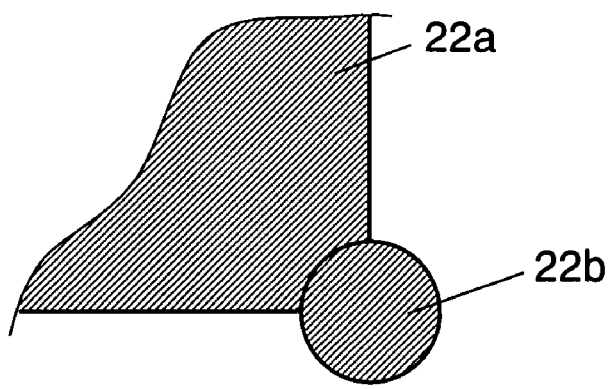
FIG. 6C shows an essential part of a sectional view of a module at the injection step shown in FIG. 2.
Figure 7A:
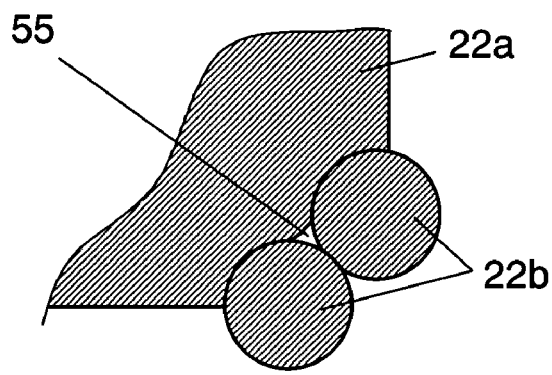
FIG. 7A shows an essential part of a sectional view of a module while resin is applied to two points of the module.
Figure 7B:
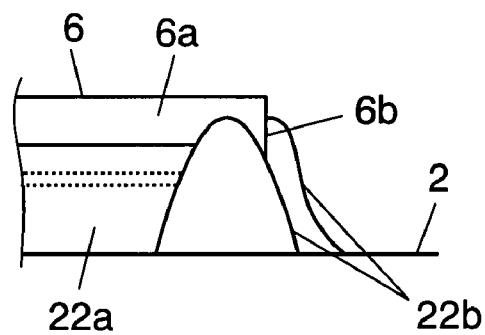
FIG. 7B shows an essential part of a sectional view of the module while resin is applied to two points of the module.
Figure 7C:
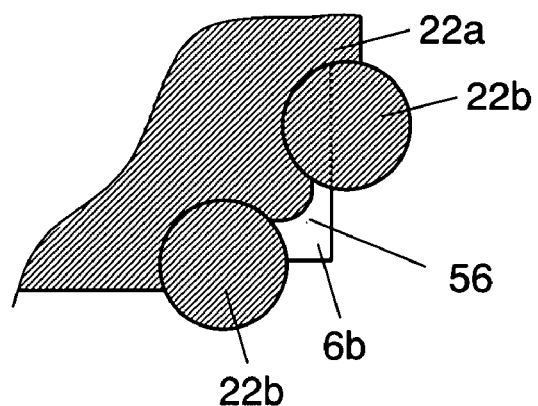
FIG. 7C shows an essential part of a sectional view of a module while resin is applied to two points of the module.
Figure 7D:
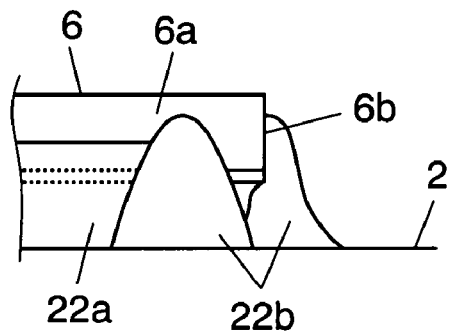
FIG. 7D shows an essential part of a sectional view of the module while resin is applied to two points of the module.

FIGS. 6A-6B show essential parts of a sectional view illustrating module 21 in injection step S34. FIGS. 6A, 6B and 6C in this order show the time-lapse in injection step S34. FIG. 7A shows an essential part enlarged from a sectional view illustrating a module with resin 22b applied to two points close to each other near the apex of corner 6b. FIG. 7B shows an essential part enlarged from a lateral view of the module shown in FIG. 7A. FIG. 7C shows an essential part enlarged from a sectional view illustrating the module with resin 22b applied to two points brought into contact each other near the apex of corner 6b. FIG. 7D shows an essential part enlarged from a lateral view of the module shown in FIG. 7C.

As shown in FIGS. 6A-6C, resin 22b is applied before resin 22a arrives at corner 6b. Resin 22b is preferably applied to one spot, i.e. an apex of corner 6b. The reason of this preference is described hereinafter with reference to FIGS. 7A-7D by taking a case as an example where resin 22b is applied to a plurality of spots of corner 6b.

The air stays in a depression formed by resin 22b at two spots cannot escape anywhere as shown in FIGS. 7A and 7B. The air thus stagnates in the depression and sometimes remains as void 55 at an interface between resin 22a and resin 22b. On the other hand, as shown in FIGS. 7C and 7D, resin 22b at two spots are away from each other; however, the space between each one of resin 22b is so small that resin 22a cannot totally fill into corner 6b, and unfilled spot 56 sometimes remains. Therefore, as shown in FIG. 6A-6C, resin 22b is preferably applied to only one spot, namely, to the apex of corner 6b. This preparation allows preventing void 55 from occurring at the interface between resin 22a and resin 22b, and yet, it also prevents unfilled spot 56 of resin 22a from occurring. Resin 22a thus can be filled positively into gap 51 between semiconductor 6 and substrate 2.

Figure 8A:
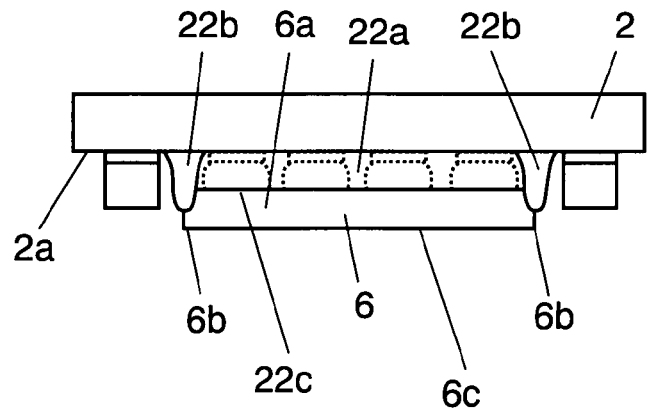
FIG. 8A shows a lateral view of a module at a reversing step shown in FIG. 2.

The steps after injection step S34 and onward are demonstrated hereinafter. Reversing step S35 takes place after step S34. As shown in FIG. 8A, reversing step S35 turns over substrate 2 by 180° so that active surface 2a faces downward. Turned over substrate 2 as it is then undergoes curing step S36, which heats substrate 2 for curing resin 22a and resin 22b simultaneously, so that the number of the steps of heating semiconductor element 6 and chip components 5 can be reduced. As a result, characteristics changes in semiconductor element 6 and chip components 5 due to the heating can be curbed. Curing step S36 is not needed to repeat anymore, so that the productivity of module 21 can be improved.

Figure 8B:
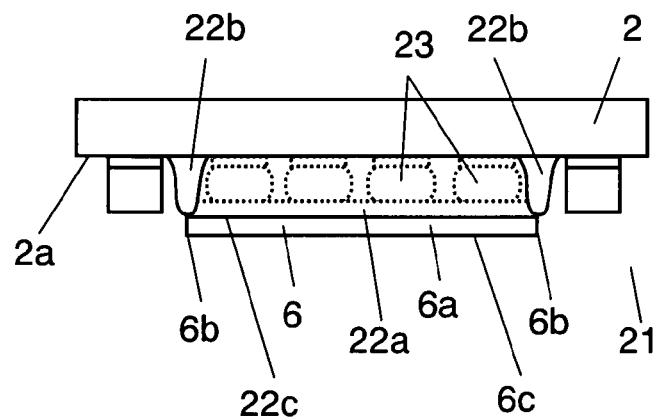
FIG. 8B shows a lateral view of a module at a curing step shown in FIG. 2.

In curing step S36 of this embodiment, substrate 2 is heated with its active surface 2a facing downward, on which active surface 2a semiconductor element 6 is mounted, so that resin 22a and resin 22b flow to top face 6c of semiconductor element 6 as shown in FIG. 8B because their viscosities are lowered due to a temperature rise. Spread of resin 22a and resin 22b on substrate 2 is thus curbed, and on top of that, resin 22a and resin 22b cover the interface (not shown) between silicon substrate 6d of semiconductor element 6 and the redistribution layer. To be more specific, e.g. boundary 22c of resin 22a moves toward top face 6c and covers the interface between silicon substrate 6d and the redistribution layer. Then further heating cures resin 22a and resin 22b while they cover the interface. After curing step S36, resin 22a and resin 22b are hardened in a state of covering the interface. Resin 22a and resin 22b thus increase their thickness at the interface. As a result, cracks or detachments of resin 22a and resin 22b at the interface can be suppressed.

Resin 22b is made of material that can maintain a higher viscosity than resin 22a in the temperature condition made by the heating in curing step S36, namely, resin 22b has a greater viscosity than resin 22a. The spread of resin 22b heated by curing step S36 is thus suppressed on substrate 2. If resin 22b is softened, the spread of resin 22b can be suppressed on substrate 2 because semiconductor element 6 is heated with its top face 6c facing downward. For instance, the viscosity of resin 22a at an ordinary temperature is approx. 10 Pa·s, and that of resin 22b is approx. 30 Pa·s.

As discussed above, resin 22b is applied before resin 22a reaches corners 6b, so that resin 22b is directly coupled to substrate 2 because no resin 22a exists between substrate 2 and resin 22b. Although resin 22a is softened by the heating in curing step S36, resin 22b is thus almost free from the influence of this softened resin 22a. On top of that, having a high viscosity, resin 22b resists spreading on substrate 2.

Curing step S36 raises a temperature by heating not higher than a melting point of solder 3 or solder bumps 23. Resin 22a and resin 22b are cured at the temperature not higher than the melting point of solder 3 or solder bumps 23, so that spillage of solder 3 and solder bumps 23 in step S36 is suppressed. Failures in contact between substrate 2 and semiconductor element 6 or chip components 5 can be thus reduced. As discussed above, curing step S36 finishes curing resin 22a and resin 22b. Module 21 is thus completely formed.

As discussed above, resin 22a and resin 22b resist spreading on substrate 2 in curing step S36, so that cover-up of chip components 5 with resin 22a and resin 22b is suppressed. Clearances 53 between semiconductor element 6 and chip components 5 can be thus narrowed, so that components can be mounted on substrate 2 at a higher density. The experiment tells that resin 22a and resin 22b never cover chip components 5 even clearances 53 are narrowed to as small as 0.3 mm.

Figure 9:
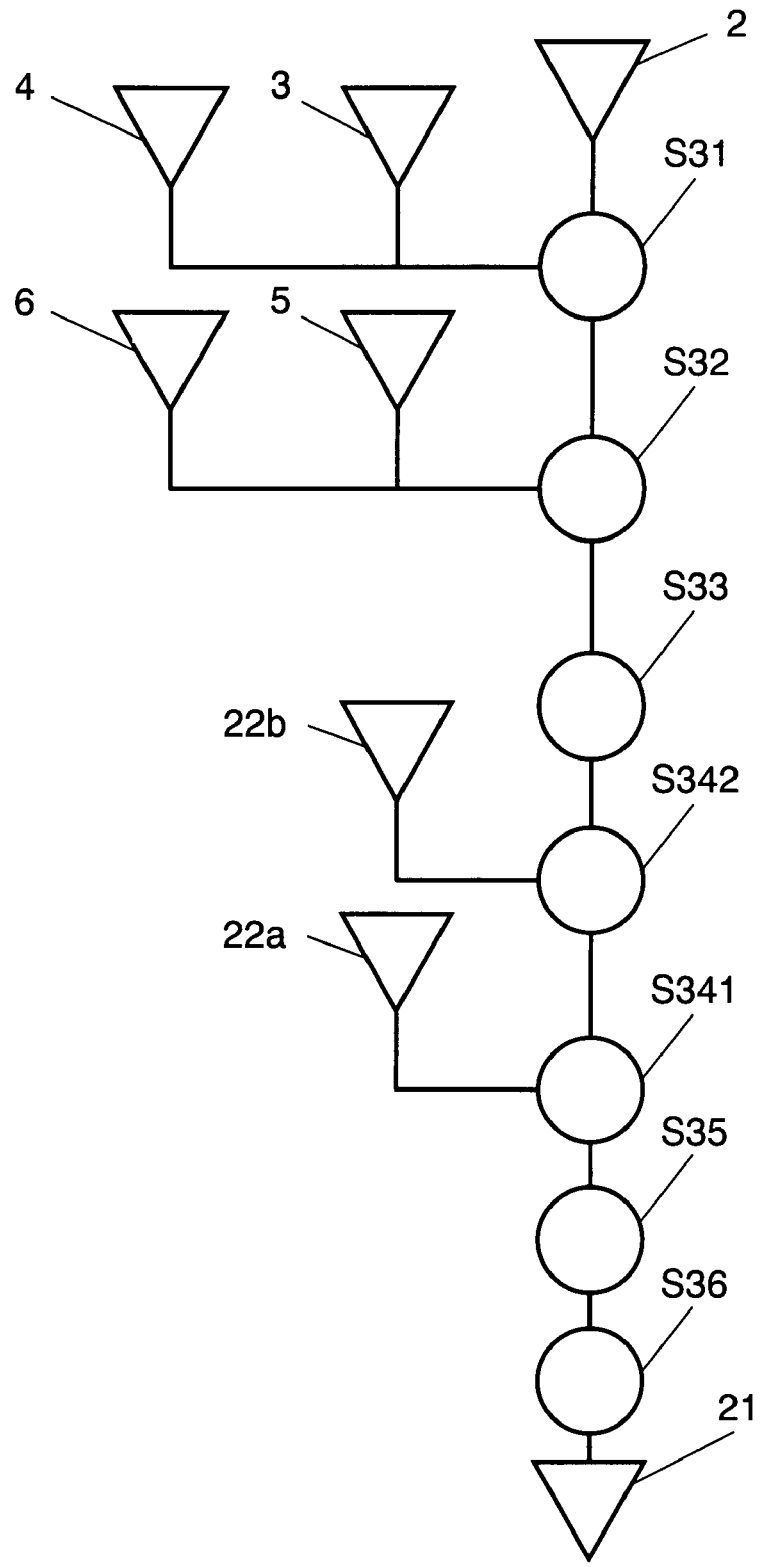
FIG. 9 shows a flowchart illustrating another method of manufacturing a module in accordance with the embodiment of the present invention.

In the manufacturing method discussed above, resin 22a and resin 22b are injected and applied simultaneously in injection step S34, and yet, they are cured simultaneously in curing step S36. However, as shown in FIG. 9, injection step S34 can include first injection step S341 for injecting resin 22a, and second injection step S342 for applying resin 22b. To be more specific, second injection step S342 applies resin 22b to corners 6b, and then first injection step S341 injects resin 22a after the completion of the application of resin 22b. Meanwhile, in second injection step S341 only one dispenser 42 can be used for applying resin 22b to each one of corners 6b sequentially. In this case one dispenser 42 is responsible for applying resin 22b to every corner 6b, so that an inexpensive application device is obtainable. First injection step S341 takes place after second injection step S342, so that the applied amount of resin 22a becomes less by the amount of resin 22a applied to corners 6b. As a result, when resin 22a is injected in the first injection step, the overflow of resin 22a from gap 51 to the outside of gap 51 is suppressed, so that even if resin 22a flows out from gap 51, clearances 52 are provided between resin 22a and solder 3 that fixes chip components 5.

Figure 10:
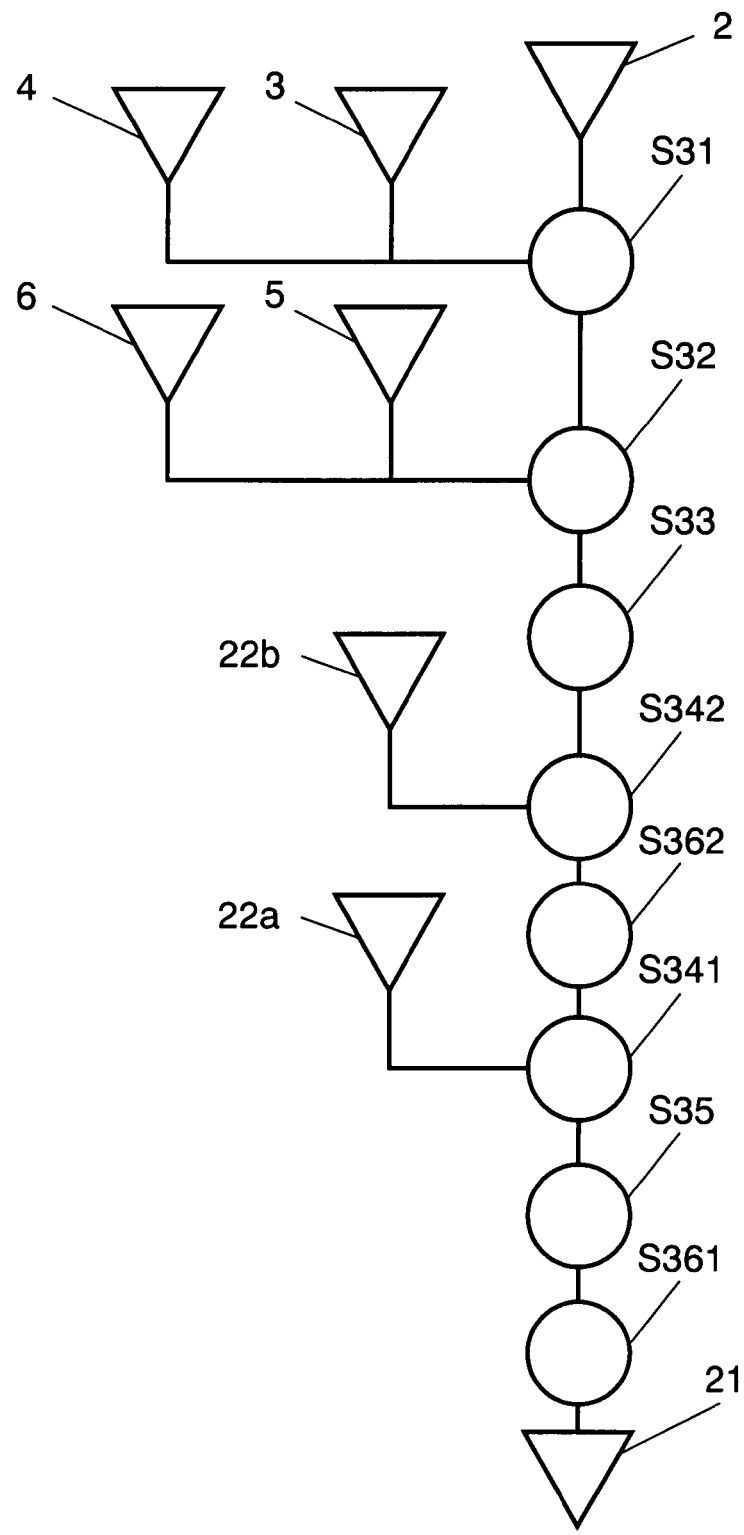
FIG. 10 shows a flowchart illustrating still another method of manufacturing a module in accordance with the embodiment of the present invention.

As shown in FIG. 10, curing step S36 can include first curing step S361 for curing resin 22a, and second curing step S362 for curing resin 22b. To be more specific, second injection step S342 applies resin 22b to corners 6b, then resin 22a is supposed to be injected; however, before that, second curing step S362 cures resin 22b in advance. Then first injection step S341 injects resin 22a. In this case resin 22b is applied before resin 22a reaches corners 6b, so that an injection amount of resin 22a is suppressed to be smaller, and the spread of resin 22a on substrate 2 is also advantageously suppressed.

Figure 11A:
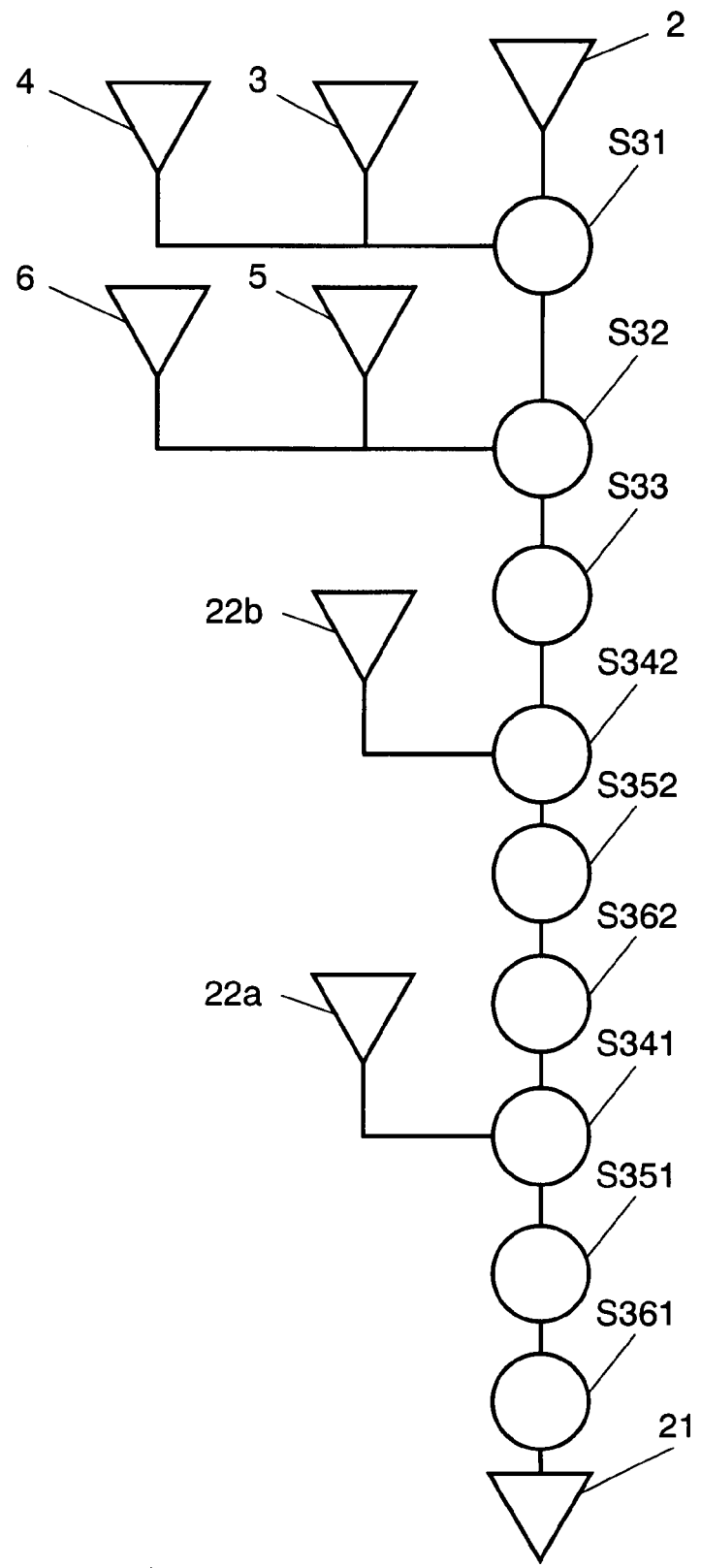
FIG. 11A shows a flowchart illustrating yet another method of manufacturing a module in accordance with the embodiment of the present invention.

As shown in FIG. 11A, reversing step S35 can include first reversing step S351 taken place before resin 22a is cured, and second reversing step S352 taken place before resin 22b is cured. To be more specific, second injection step S342 applies resin 22b to corners 6b, then second reversing step S352 turns over substrate 2 by 180°, such that active surface 2a faces downward, before resin 22a is injected. Then second curing step S362 cures resin 22b, and then first injection step S341 injects resin 22a. In this case, resin 22b is applied before resin 22a reaches corners 6b, so that an injection amount of resin 22a is regulated to be smaller, and the spread of resin 22a on substrate 2 is suppressed.

Figure 11B:
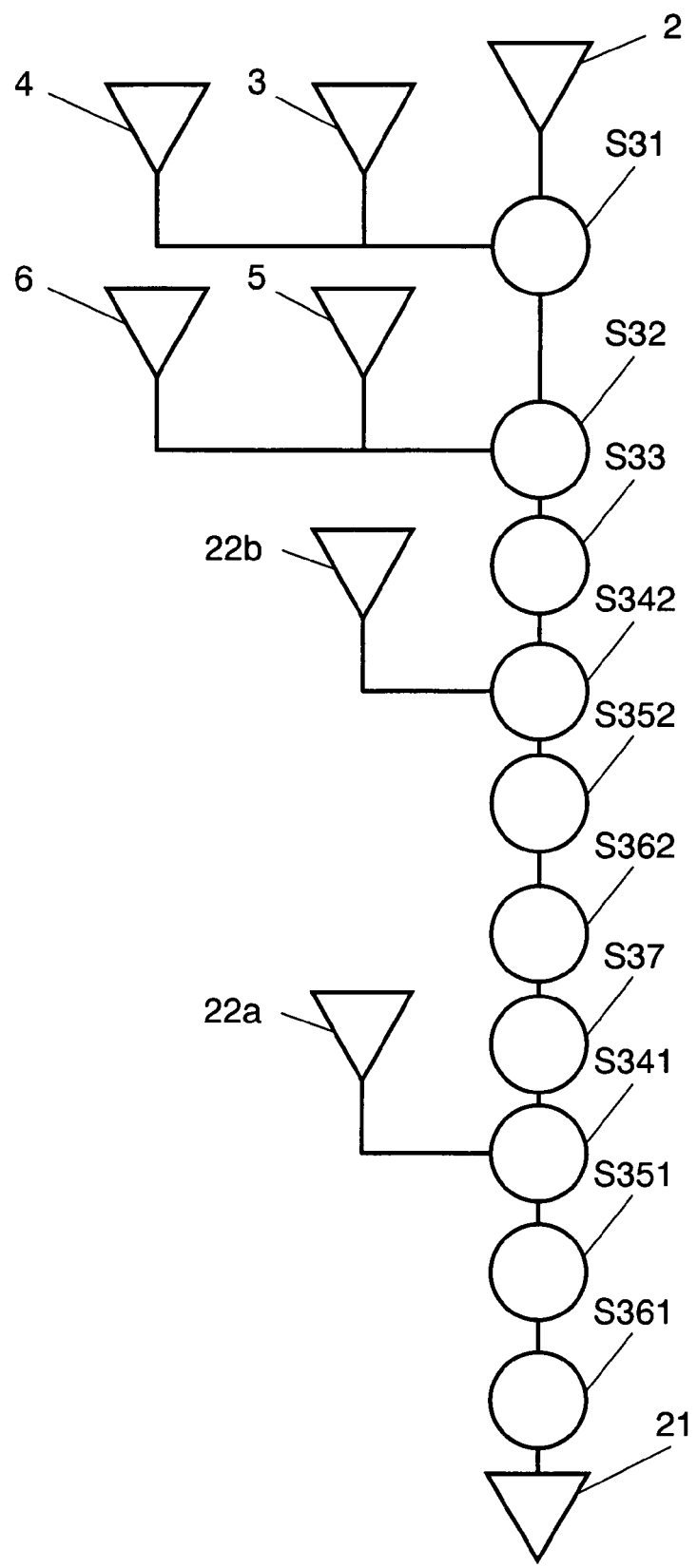
FIG. 11B shows a flowchart illustrating yet still another method of manufacturing a module in accordance with the embodiment of the present invention.
Figure 12:
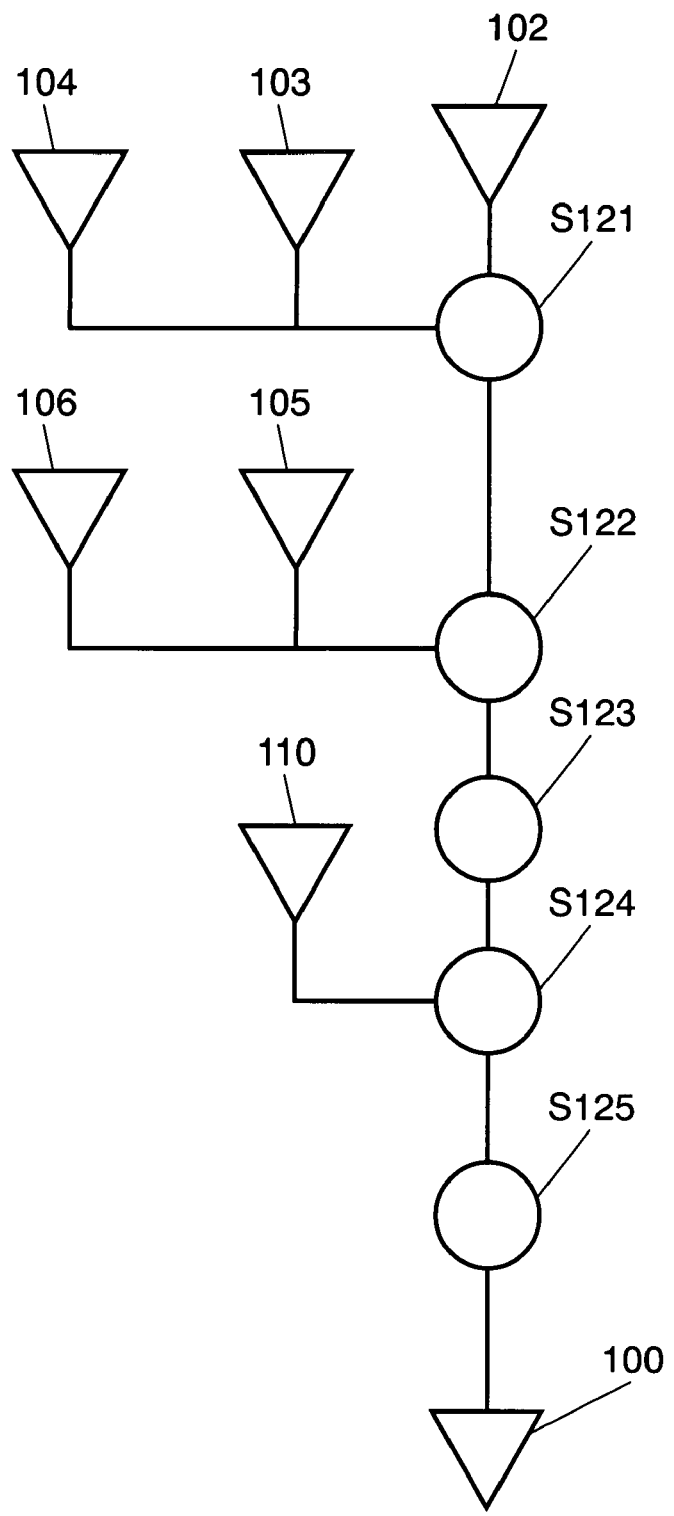
FIG. 12 shows a flowchart illustrating a method of manufacturing a conventional module.
Figure 13A:
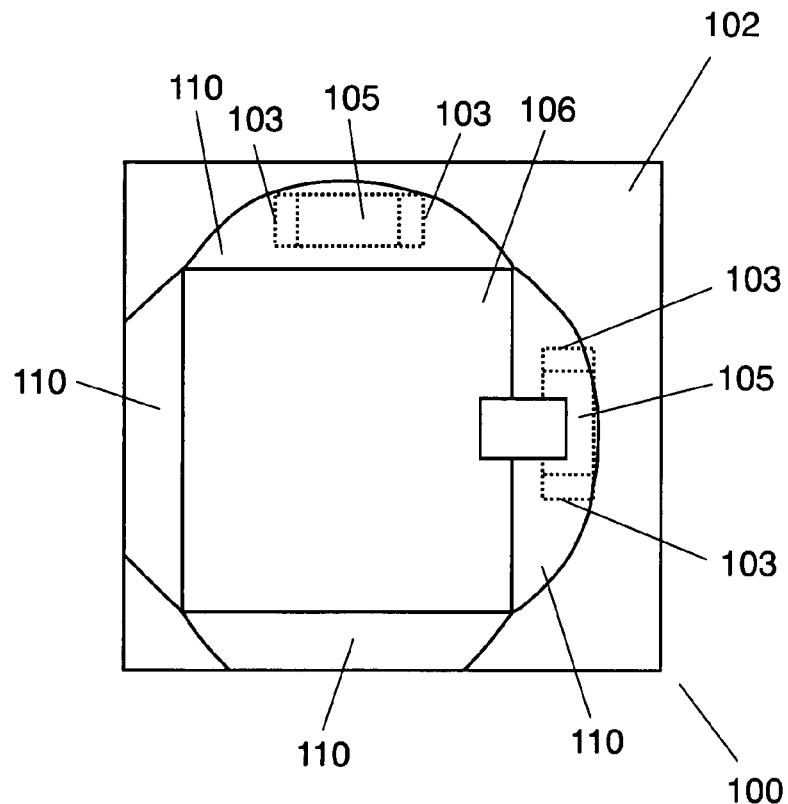
FIG. 13A shows a top view of a conventional module at an injection step shown in FIG. 12.
Figure 13B:
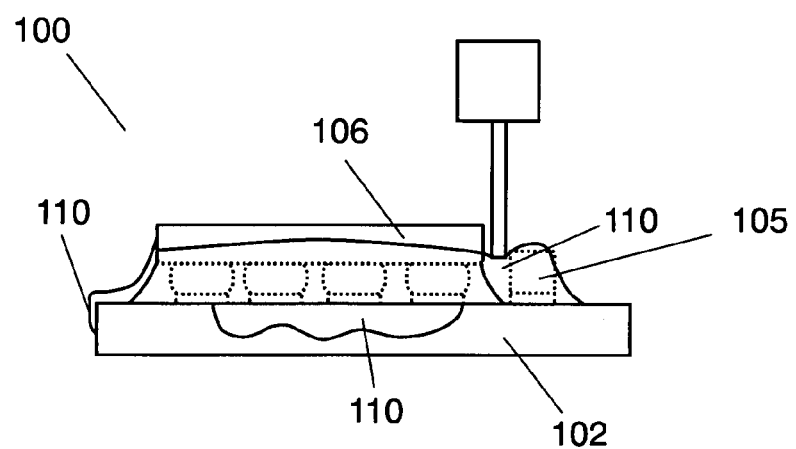
FIG. 13B shows a lateral view of the module shown in FIG. 13A.
Figure 14A:
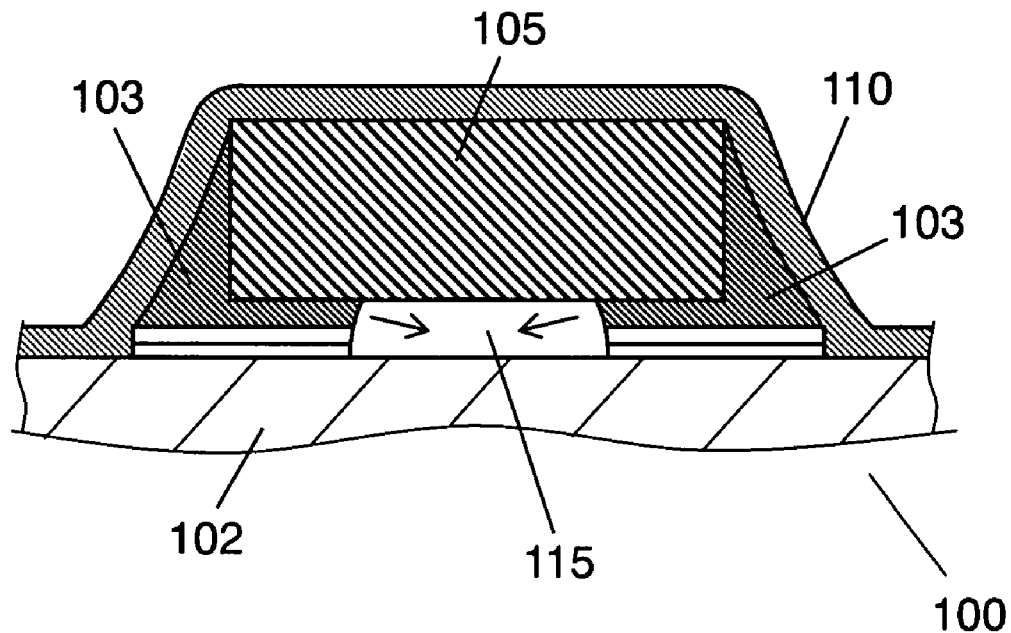
FIG. 14A shows a sectional view of a conventional chip component.
Figure 14B:
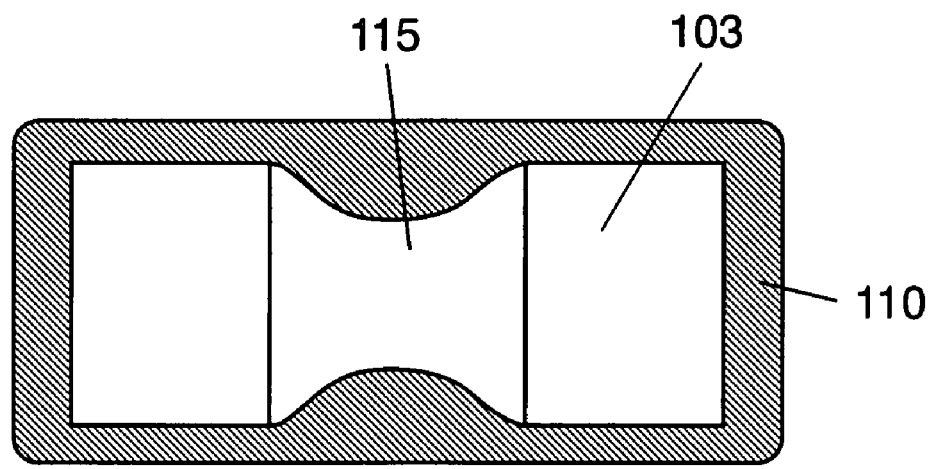
FIG. 14B shows an essential part of a sectional view illustrating a soldered spot of the conventional chip component.

As shown in FIG. 11B, before first injection step S341 takes place, normal rotation step S37 can be carried out for turning substrate 2 by 180° such that active surface 2a faces upward. In this case, when first injection step S341 is carried out, resin 22a is injected with active surface 2a facing upward.

What is claimed is:

1. A method of manufacturing a module, the module includes a semi-conductor element flip-chip bonded on a substrate and a chip component soldered to the substrate, the method comprising:
    a mounting step for mounting the chip component and the semiconductor element to the substrate;
    a first injection step for injecting first thermosetting resin from a center section of a lateral face of the semiconductor element into a gap between the semiconductor element and the substrate;
    a second injection step for applying second thermosetting resin having a greater viscosity than the first thermosetting resin to a corner of the semiconductor element before the first resin reaches the corner; and
    a curing step for heating the substrate to cure the first resin and the second resin.

2. The manufacturing method of claim 1, wherein the first injection step and the second injection step are carried out simultaneously.

3. The manufacturing method of claim 1, wherein the first resin is cured while a surface of the substrate faces downward, on which surface the semiconductor element is mounted.

4. The manufacturing method of claim 1, wherein the first injection step is carried out after the second injection step takes place.

5. The manufacturing method of claim 1, wherein the curing step includes
    a first curing step for curing the first resin after the first injection step, and
    a second curing step for curing the second resin before the first injection step.

6. The manufacturing method of claim 5, wherein the second resin is cured while a surface of the substrate faces downward, one which surface the semiconductor element is mounted.

7. The manufacturing method of claim 1, wherein the curing step cures the first resin and the second resin simultaneously.

8. The manufacturing method of claim 1, wherein the first injection step injects the first resin so as to make a clearance between solder, that fixes the chip component, and the first resin flowed out from the gap between the semiconductor element and the substrate.

9. The manufacturing method of claim 1, wherein the second resin is applied to each one of four apexes of the corners of the semiconductor element.

* * * * *